United States Patent
Ricard et al.

(10) Patent No.: US 9,257,956 B2
(45) Date of Patent: Feb. 9, 2016

(54) PASSIVE FILTER

(71) Applicant: STMicroelectronics SA, Montrouge (FR)

(72) Inventors: Jean-Christophe Ricard, Aveyron (FR); Cedric Durand, St Martin D'heres (FR); Frederic Gianesello, Saint Pierre d'Albigny (FR)

(73) Assignee: STMICROELECTRONICS SA, Montrouge (FR)

( * ) Notice: Subject to any disclaimer, the term of this patent is extended or adjusted under 35 U.S.C. 154(b) by 212 days.

(21) Appl. No.: 14/030,357

(22) Filed: Sep. 18, 2013

(65) Prior Publication Data

US 2014/0091881 A1 Apr. 3, 2014

(30) Foreign Application Priority Data

Sep. 28, 2012 (FR) .................................... 12 59145

(51) Int. Cl.
*H03H 7/01* (2006.01)
*H03H 3/00* (2006.01)
*H03H 7/12* (2006.01)
(Continued)

(52) U.S. Cl.
CPC .............. *H03H 7/0138* (2013.01); *H03H 3/00* (2013.01); *H03H 7/0115* (2013.01); *H03H 7/0161* (2013.01); *H03H 7/075* (2013.01); *H03H 7/12* (2013.01); *H03H 7/1758* (2013.01); *H03H 7/1766* (2013.01); *H03H 7/1783* (2013.01); *H03H 7/1791* (2013.01); *H03H 7/463* (2013.01)

(58) Field of Classification Search
CPC . H03H 7/0115; H03H 7/1775; H03H 7/0161; H03H 7/12; H03H 7/1783; H03H 7/0138; H03H 3/00; H03H 7/075; H03H 7/1758; H03H 7/463; H03H 7/1766; H03H 7/1791
USPC ................................... 333/167–176, 185, 132
See application file for complete search history.

(56) References Cited

U.S. PATENT DOCUMENTS

| 2,167,522 | A | | 7/1939 | Nitz | |
|---|---|---|---|---|---|
| 4,931,921 | A | * | 6/1990 | Anderson | ............... H03B 19/06 327/119 |
| 5,042,085 | A | * | 8/1991 | Errico | .............................. 455/43 |

(Continued)

FOREIGN PATENT DOCUMENTS

| JP | 57097715 | 6/1982 |
|---|---|---|
| JP | 59047823 | 3/1984 |

(Continued)

OTHER PUBLICATIONS

Wing-Yan Leung et al., "Multilayer LTCC Bandpass Filter Design with Enhanced Stopband Characteristics", IEEE Microwave and Wireless Components Letters, vol. 12, No. 7, Jul. 2002 pp. 240-242, XP011427703, Figure 1.

*Primary Examiner* — Benny Lee
*Assistant Examiner* — Rakesh Patel
(74) *Attorney, Agent, or Firm* — Allen, Dyer, Doppelt, Milbrath & Gilchrist, P.A.

(57) ABSTRACT

A passive filter may include at least one elliptical filter unit and at least one asymmetric rejection filter unit coupled in series with the elliptical filter unit. The at least one asymmetric rejection filter unit may have a frequency response curve that includes a dip with different attenuations on either side, and an overshoot upon exiting the dip at the side with the lower attenuation.

27 Claims, 2 Drawing Sheets

(51) Int. Cl.
   *H03H 7/075* (2006.01)
   *H03H 7/46* (2006.01)

(56) References Cited

U.S. PATENT DOCUMENTS

| | | | |
|---|---|---|---|
| 2004/0066337 A1 | 4/2004 | Fukuda et al. | |
| 2006/0145782 A1* | 7/2006 | Liu et al. | 333/132 |
| 2006/0158282 A1* | 7/2006 | Chen | 333/185 |
| 2008/0055017 A1 | 3/2008 | Shafer | |
| 2008/0204163 A1* | 8/2008 | Royak et al. | 333/132 |
| 2010/0171565 A1 | 7/2010 | Okada | |
| 2010/0308933 A1* | 12/2010 | See et al. | 333/32 |
| 2012/0112853 A1 | 5/2012 | Hikino et al. | |

FOREIGN PATENT DOCUMENTS

| | | |
|---|---|---|
| JP | 06090128 | 3/1994 |
| JP | 2006262349 | 9/2006 |
| JP | 2008278100 | 11/2008 |

* cited by examiner

PASSIVE FILTER

FIELD OF THE INVENTION

The invention relates to a passive filter, and more particularly, to a filter for selecting a radio frequency band.

BACKGROUND OF THE INVENTION

Current mobile phones are designed to operate in multiple radio frequency bands to be compatible with the existing telecommunication standards (GSM, 3G, WCDMA, LTE), which may vary from country to country. The 3G standard, in one country, requires five pairs of bands. Two bands of a pair are respectively used for transmission and reception in full duplex. If the LTE standard is added, seven pairs of bands are to be in the same country. If it is desirable to cover the bands used for the 3G and LTE standards in all countries, ten pairs of bands are to be used.

FIG. 1 is a schematic diagram of a transceiver stage of a mobile phone designed to handle one pair of bands. The transceiver stage includes a duplexer 10 formed by a pair of bandpass filters, one for conveying an incoming signal Rx arriving on an antenna, the other for transmitting on the antenna an outgoing signal Tx arriving via a power amplifier PA.

FIG. 2 is a diagram illustrating the response curves, one in a solid line and the other in a dashed line, of the two bandpass filters of a duplexer. The frequency response of each filter is characterized by the bandwidth B, the gap between the two bands BG, the insertion loss IL (attenuation compared to the level of the original signal), the rejection ratio R from the other band, and the slope S between the bands.

The characteristics that may be of a more particular interest are the slope S and the rejection ratio R, which increase when both bands become closer. A worst case, for example, is for the LTE US and LTE EU standards, which require a 20 MHz gap BG between bands at frequencies around 2 GHz. For example, for the LTE US standard, the transmission band is between 1850 and 1910 MHz, and the reception band is between 1930 and 1990 MHz.

Thus, templates may be imposed on the duplexer filters. These templates have typically been met in practice by surface acoustic wave filters (SAW) or bulk acoustic wave filters (BAW).

SAW or BAW filters, having a very limited frequency range for adjusting their bandwidth, cannot typically be adjusted to cover multiple bands. The result is that a separate duplexer is used for each pair of bands, and that ten duplexers may be required with corresponding auxiliary circuits (amplifiers PA), independently switched on the antenna, if a universal mobile phone platform is desired.

In theory, active filters or passive elliptical filters may satisfy the templates. Such filters may have a satisfactory frequency adjustment range, which may reduce the number of duplexers by making each duplexer tunable over several neighboring bands. However, the power consumption of active filters may be prohibitive for battery-operated devices. As for elliptical filters, there are no inductors on the market with a sufficient quality factor, so that the actual characteristics of these filters differ too much from the theoretical characteristics that satisfy the templates.

SUMMARY OF THE INVENTION

Thus, it may be desirable to provide a low power filter structure that satisfies the templates corresponding to the mobile telephone standards while providing an adjustment range that may cover several frequency bands defined by these standards. This desire is addressed by a passive filter that includes at least one elliptical filter unit and, in series with the elliptical filter unit, at least one asymmetric rejection filter unit whose frequency response curve includes a dip with different attenuations on either side and an overshoot upon exiting the dip at the side with the lower attenuation.

According to an embodiment, the asymmetric rejection filter unit is adjusted so that the overshoot coincides, in frequency, with the vicinity of the top of a slope of the response curve of the elliptical filter unit. According to an embodiment, the asymmetric rejection filter unit is a high-pass unit that includes a series capacitor and a parallel element. The parallel element includes, connected in series, a resonant element including a resonance capacitor and an inductor connected in parallel, and a parallel capacitor.

According to an embodiment, the asymmetric rejection filter unit is a low-pass unit that includes a parallel capacitor and a series element. The series element includes, connected in parallel, a resonant element including a resonance capacitor and an inductor connected in series, and a series capacitor.

According to an embodiment, the elliptical filter unit is a high-pass unit that includes a series capacitor, and a parallel resonant element including a resonance capacitor and an inductor connected in series. According to an embodiment, the elliptical filter unit is a low-pass unit that includes a parallel capacitor, and a series resonant element including a resonance capacitor and an inductor connected in parallel.

A band-pass filter may include at least three different types of units coupled in series and selected from a high-pass asymmetric rejection unit, a low-pass asymmetric rejection unit, a high-pass elliptical filter unit, and a low-pass elliptical filter unit. According to an embodiment, the inductors are fixed and the capacitors are adjustable. An integrated circuit may incorporate a filter of the types mentioned above, wherein the inductors are external to the integrated circuit, and the capacitors are internal to the integrated circuit and switchable between multiple fixed values.

DETAILED DESCRIPTION OF THE PREFERRED EMBODIMENTS

Figure 1:
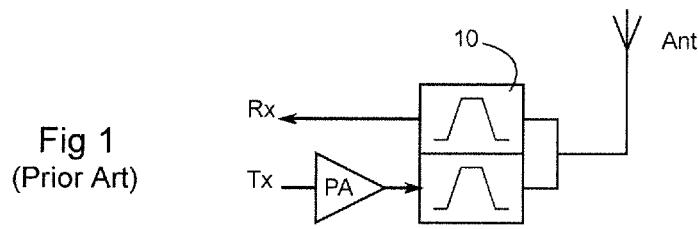
FIG. 1 is a schematic diagram of a transceiver stage of a mobile phone in accordance with the prior art.
Figure 2:
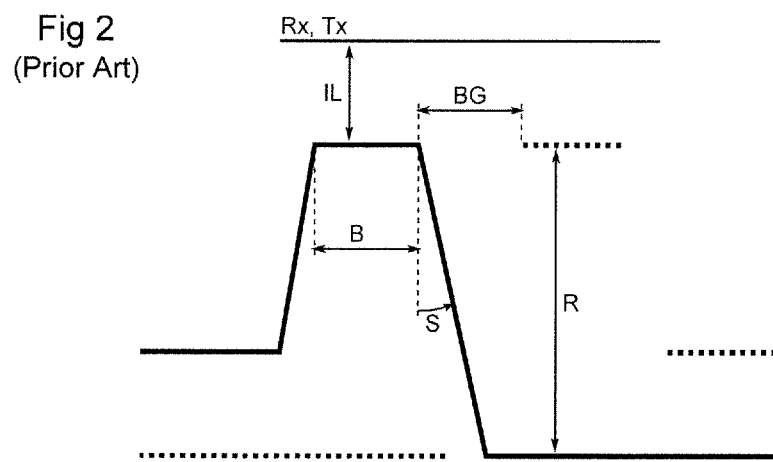
FIG. 2 is a diagram of response curves of two filters of a duplexer in accordance with the prior art.
Figure 3:
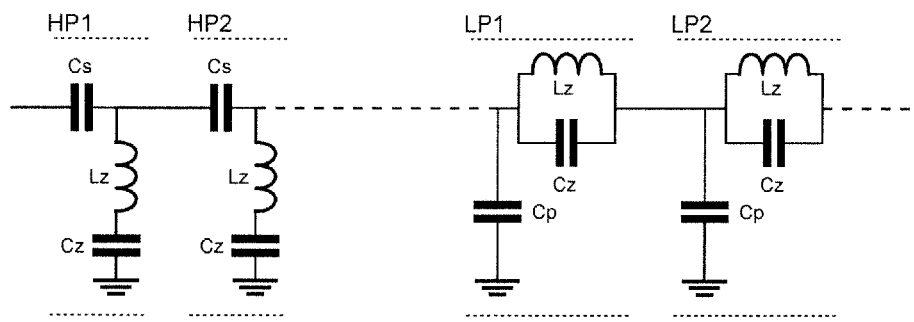
FIG. 3 is a schematic diagram of an elliptical bandpass filter in accordance with the prior art.

FIG. 3 schematically illustrates a passive elliptical bandpass filter. The filter has a ladder structure. The filter includes a succession of high-pass units HP of same structure, followed by a succession of low-pass units LP of same structure. The input of each unit is connected to the output of the previous unit.

Each high-pass unit HP includes a series capacitor Cs and a parallel resonant element that includes a resonance capacitor Cz and a resonance inductor Lz connected in series. The low-pass and high-pass units have dual structures. Each low-pass unit LP thus includes a parallel capacitor Cp and a resonant element that includes a series resonance capacitor Cz and a resonance inductor Lz connected in parallel. Although homologous capacitors and inductors of the units have same references, their values are determined by the desired response curve and may thus vary.

Theoretical calculations show that an elliptical filter of the type illustrated in FIG. 3 may, with nine units for transmission and eight units for reception, satisfy the mobile telephony standard templates. In addition, by making the capacitors switchable between multiple values, a single filter may cover several neighboring bands.

However, even when relaxing the rejection constraint from 45 dB to 20 dB, the quality factor of the inductors may typically be greater than 300 to satisfy the other constraints of the templates. Real inductors, external circuit elements, may be available on the market with quality factors of the order of 150, at best.

Figure 4:
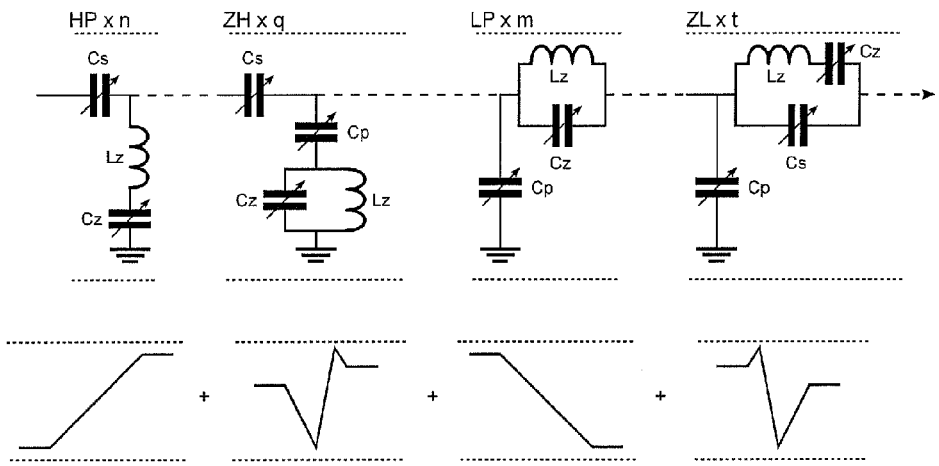
FIG. 4 is a schematic diagram of a filter structure derived from an elliptical filter in accordance with the present invention.

FIG. 4 schematically shows a structure of a band-pass filter derived from an elliptical structure, which offers sufficient performance with lower quality factor inductors. In addition to n high-pass filter units HP and m low-pass filter units LP of a conventional elliptical structure, "asymmetric rejection" units are provided, also arranged in a "ladder" like the elliptical filter units. The asymmetric rejection units include q high-pass units designated ZH, and t low-pass units designated ZL.

In general, the band-pass filter is such that n, q, m and t are integers that may be null. The units are preferably grouped by units of same nature, but groups of units may be placed in any order in the ladder—the order of the units, even if the component values are unchanged, influences the characteristics of the filter.

Under each group of units a corresponding frequency response curve is illustrated. The response curves of groups HP and LP are high-pass and low-pass curves respectively. The response curve of a group ZH (high-pass asymmetric rejection) has a dip having a greater attenuation on its low frequency side than on its high frequency side, and an overshoot on its high frequency side. The response curve of a group ZL (low-pass asymmetric rejection) has a dip having a greater attenuation on its high frequency side than on its low frequency side, and an overshoot on its low frequency side.

The slope between the dip bottom and the overshoot of units ZH and ZL is steeper than the slope of the HP and LP elliptical units. Thus, by placing the dip of a group of units ZL or ZH on the slope of a group of corresponding units HP or LP, the slope of the global response curve may be locally increased. The overshoot of units ZH and ZL locally reduces the attenuation of the response curves, where the elliptical units including low quality factor inductors have an excessively rounded response curve. A starting point for designing units ZH and ZL is the placement of the overshoots, in frequency, near the tops of the slopes of the corresponding elliptical units.

The desired characteristics of units ZH and ZL may be obtained with the shown passive structures. A ZH unit includes a series capacitor Cs and a parallel element including a parallel capacitor Cp connected in series with a parallel resonant element. The parallel resonant element includes a resonant capacitor Cz and an inductor Lz connected in parallel. The structure of a ZL unit is similar to that of a ZH unit in that it includes a parallel capacitor Cp and a series element including a series capacitor Cs connected in parallel with a series resonant element. The series resonant element includes a resonant capacitor Cz and an inductor Lz connected in series.

Figure 5A:
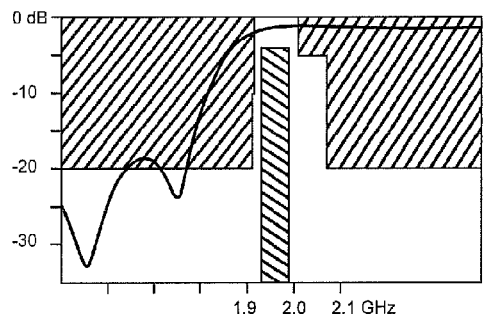
FIGS. 5A-5C are graphs illustrating a template and examples of filter response curves corresponding to a filter of the type illustrated in FIG. 4.
Figure 5B:
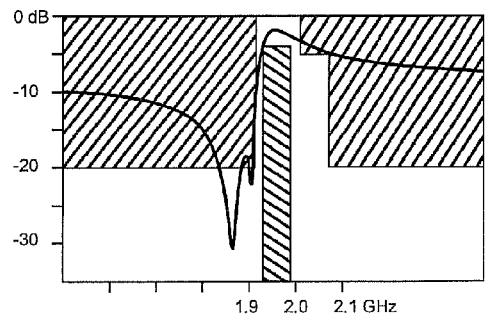
Figure 5C:
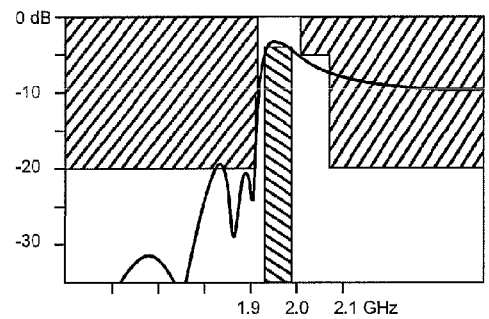

FIGS. 5A-5C show an exemplary template and sample response curves obtained with real components, respectively, for a group of high-pass elliptical units HP, a group of high-pass asymmetric rejection units ZH, and the combination of both groups of units, forming a high-pass filter. The template corresponds to the 1920-1980 MHz band used for transmission by one alternative of the LTE standard. It may be desirable that the frequency response of the filter not enter "prohibited" hatched areas.

FIG. 5A shows the response curve of a sample group including two elliptical high-pass units. This curve does not satisfy the template, in particular because its slope is not steep enough. To steepen the slope, the filter order may be increased by increasing the number of units. A side effect is that this technique degrades the insertion loss (the level of the horizontal plateau of the curve). Nonetheless, with real inductors having a quality factor that does not exceed 150, the curve generally cannot be made to pass above the central forbidden zone of the template, even though the slope may be steep enough, because the curve is too rounded at this level.

FIG. 5B shows the response curve of a sample group of three units ZH. Even with real components, it may be possible to adjust the ZH units so that the overshoot of the response curve passes over the prohibited central area. The overshoot is located, in frequency, at the top of the slope of the curve in FIG. 5A. The slope preceding the overshoot almost achieves the desired rate to enter into the left forbidden zone, but the curve penetrates this forbidden zone at lower frequencies.

FIG. 5C shows the frequency response of a filter including the series connection of the unit groups of FIGS. 5A and 5B. In this instance, the response curve respects the template on the low frequency side (only a high-pass filter has been described).

To also respect the template on the high frequency side and produce a band-pass filter, elliptical low-pass units, ZL units, or a combination of both are added, based upon on the desired constraints to be met. Most phone standard templates can be satisfied with three among the four types of units described.

Thus, a filter according to the embodiments described herein may include substantially the same number of units than a traditional elliptical filter that would have been designed using ideal components to satisfy a template. For example, the component values of the three units ZH achieving the response curve of FIG. 5B were:

Cs: 8.5 pF, 2.5 pF, 4 pF;
Cp: 0.6 pF, 0.75 pF, 1.53 pF;
Cz: 5.3 pF, 5.24 pF, 10.75 pF; and
Lz: 1.2 nH 1.2 nH 0.6 nH.

The inductors Lz that were used are SMD inductors having a quality factor of about 150, and the capacitors are integrated CMOS capacitors. By making the capacitors adjustable, as illustrated in FIG. 4, a single filter may be used for up to four neighboring bands of 60 MHz. It may even be possible to cover more than four bands. The adjustable capacitors may be formed as a plurality of switched capacitors of fixed values, for example. Thus, the ten pairs of bands to satisfy the variants of the 3G and LTE standards used throughout the world may be covered by three or four duplexers including filters which combine elliptical units and asymmetric rejection units.

That which is claimed is:

1. A method of making a passive filter comprising:
providing at least one elliptical filter; and
coupling at least one asymmetric rejection filter in series with the at least one elliptical filter, the at least one asymmetric rejection filter having a frequency response curve including a dip with different attenuations on opposing sides of the dip, and an overshoot upon exiting the dip adjacent the side with a lower attenuation, the overshoot coinciding, in frequency, with, and being adjacent to a top of a slope of a frequency response curve of said at least one elliptical filter.

2. The method of claim 1, wherein coupling the at least one asymmetric rejection filter comprises coupling at least one high-pass filter.

3. The method of claim 1, wherein coupling the at least one asymmetric rejection filter comprises:
coupling a resonance capacitor to a first capacitor;
coupling an inductor in parallel with the resonance capacitor; and
coupling a second capacitor in series with the resonance capacitor and the inductor.

4. The method of claim 1, wherein coupling the at least one asymmetric rejection. filter comprises coupling at least one low-pass asymmetric rejection filter.

5. The method of claim 1, wherein coupling the at least one asymmetric rejection filter comprises:
coupling a resonance capacitor coupled to a first capacitor;
coupling an inductor in series with the resonance capacitor; and
coupling a second capacitor in parallel with the resonance capacitor and the inductor.

6. The method of claim 1, wherein providing the at least one elliptical filter comprises providing at least one high-pass elliptical filter.

7. The method of claim 1, wherein providing the at least one elliptical filter comprises providing at least one elliptical filter by at least:
coupling a resonance capacitor to a capacitor; and
coupling an inductor in series with the resonance capacitor.

8. The method of claim 1, wherein providing the at least one elliptical filter comprises providing at least one low-pass elliptical filter.

9. The method of claim 1, wherein providing the at least one elliptical filter comprises providing at least one elliptical filter by at least:
coupling a resonance capacitor coupled to a capacitor; and
coupling an inductor coupled in parallel with the resonance capacitor.

10. A passive filter comprising:
at least one elliptical filter; and
at least one asymmetric rejection filter coupled in series with said at least one elliptical filter and having a frequency response curve including a dip with different attenuations on opposing sides of the dip, and an overshoot upon exiting the dip adjacent to the side with a lower attenuation, the overshoot coinciding, in frequency, with, and being adjacent a top of a slope of a frequency response curve of said at least one elliptical filter.

11. The passive filter of claim 10, wherein said at least one elliptical filter comprises:
a capacitor;
a resonance capacitor coupled to said capacitor; and
an inductor coupled in parallel with said resonance capacitor.

12. The passive filter of claim 10, wherein said at least one asymmetric rejection filter comprises at least one high-pass filter.

13. The passive filter of claim 10, wherein said at least one asymmetric rejection filter comprises:
a first capacitor;
a resonance capacitor coupled to said first capacitor;
an inductor coupled in parallel with said resonance capacitor; and
a second capacitor coupled in series with said resonance capacitor and said inductor.

14. The passive filter of claim 10, wherein said at least one asymmetric rejection filter comprises at least one low-pass asymmetric rejection filter.

15. The passive filter of claim 10, wherein said at least one asymmetric rejection filter comprises:
a first capacitor;
a resonance capacitor coupled to said first capacitor;
an inductor coupled in series with said resonance capacitor; and
a second capacitor coupled in parallel with said resonance capacitor and said inductor.

16. The passive filter of claim 10, wherein said at least one elliptical filter comprises at least one high-pass elliptical filter.

17. The passive filter of claim 10, wherein said at least one elliptical filter comprises:
a capacitor;
a resonance capacitor coupled to said capacitor; and
an inductor coupled in series with said resonance capacitor.

18. The passive filter of claim 10, wherein said at least one elliptical filter comprises at least one low-pass elliptical filter.

19. A band-pass filter comprising:
first, second, and third filters coupled in series;
said first filter comprising a high-pass elliptical filter;
said second filter comprising a high-pass asymmetric rejection filter comprising
a first capacitor,
a resonance capacitor coupled to said first capacitor,
an inductor coupled in parallel with said resonance capacitor, and
a second capacitor coupled in series with said resonance capacitor and said inductor; and
said third filter comprising one of
a low-pass asymmetric rejection filter comprising
a first capacitor,
a resonance capacitor coupled to said first capacitor,
an inductor coupled in series with said resonance capacitor, and
a second capacitor coupled in parallel with said resonance capacitor and said inductor, and
a low-pass elliptical filter comprising
a first capacitor,
a resonance capacitor coupled to said first capacitor, and
an inductor coupled in parallel with said resonance capacitor,
said high-pass elliptical filter comprising
a first capacitor,
a resonance capacitor coupled to said first capacitor, and
an inductor coupled in series with said resonance capacitor.

20. The band-pass filter of claim 19, wherein said respective inductors comprise corresponding fixed inductors; and wherein said respective first capacitors, said respective second capacitors, and said respective resonance capacitors each comprises a corresponding adjustable capacitor.

21. An integrated circuit (IC) device comprising:
an inductor; and an IC filter comprising a high-pass elliptical filter, a high-pass asymmetric rejection filter, and at least one of a low-pass asymmetric rejection filter and a low-pass elliptical filter;

said high-pass asymmetric rejection filter comprising
- a first capacitor, and
- a resonance capacitor coupled to said first capacitor and coupled in parallel with said inductor, and
- a second capacitor coupled in series with said resonance capacitor and coupled in series with said inductor, said low-pass asymmetric rejection filter comprising
- a first capacitor,
- a resonance capacitor coupled to said first capacitor and coupled in series with said inductor, and
- a second capacitor coupled in parallel with said resonance capacitor and coupled in parallel with said inductor, said high-pass elliptical filter comprising
- a first capacitor,
- a resonance capacitor coupled to said first capacitor and coupled in series with said inductor, and said low-pass elliptical filter comprising
- a first capacitor,
- a resonance capacitor coupled to said first capacitor and coupled in parallel with said inductor.

22. The IC device of claim 21, wherein said inductor comprises a fixed inductor; and wherein said respective first capacitors, said respective second capacitors, and said respective resonance capacitors each comprises a corresponding adjustable capacitor.

23. The IC device of claim 22, wherein each of said first capacitors, second capacitors, and resonance capacitors are configured to be switchable among a plurality of fixed values.

24. A passive filter comprising:
- at least one high-pass elliptical filter; and
- at least one high-pass asymmetric filter coupled in series with said elliptical filter and having a frequency response curve including a dip with different attenuations on opposing sides of the dip, and an overshoot upon exiting the dip adjacent the side with a lower attenuation.

25. The passive filter of claim 24, wherein said at least one high-pass elliptical filter comprises:
- a capacitor;
- a resonance capacitor coupled to said capacitor; and
- an inductor coupled in series with said resonance capacitor.

26. A method of making a passive filter comprising:
providing at least one high-pass elliptical filter; and
coupling at least one high-pass asymmetric rejection filter in series with the at least one elliptical filter, the at least one high-pass asymmetric rejection filter having a frequency response curve including a dip with different attenuations on opposing sides of the dip, and an overshoot upon exiting the dip adjacent the side with a lower attenuation.

27. The method of claim 26, wherein providing the at least one high-pass elliptical filter comprises providing at least one elliptical filter by at least:
coupling a resonance capacitor to a capacitor; and
coupling an inductor in series with the resonance capacitor.

* * * * *